(12) United States Patent
Pikulin et al.

(10) Patent No.: US 11,201,273 B2
(45) Date of Patent: Dec. 14, 2021

(54) SEMICONDUCTOR-SUPERCONDUCTOR HETEROSTRUCTURE

(71) Applicant: Microsoft Technology Licensing, LLC, Redmond, WA (US)

(72) Inventors: Dmitry Igorevich Pikulin, Goleta, CA (US); Geoffrey Charles Gardner, West Lafayette, IN (US); Raymond Leonard Kallaher, Indianapolis, IN (US); Georg Wolfgang Winkler, Santa Barbara, CA (US); Sergei Vyatcheslavovich Gronin, Indianapolis, IN (US); Peter Krogstrup Jeppesen, Copenhagen (DK); Michael James Manfra, West Lafayette, IN (US); Andrey Antipov, Santa Barbara, CA (US); Roman Mykolayovych Lutchyn, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/570,745

(22) Filed: Sep. 13, 2019

(65) Prior Publication Data

US 2021/0083166 A1 Mar. 18, 2021

(51) Int. Cl.
| | |
|---|---|
| H01L 39/02 | (2006.01) |
| H01L 27/18 | (2006.01) |
| G06N 10/00 | (2019.01) |
| H01L 39/22 | (2006.01) |
| H01L 39/24 | (2006.01) |
| H01L 39/12 | (2006.01) |

(52) U.S. Cl.
CPC .......... *H01L 39/025* (2013.01); *G06N 10/00* (2019.01); *H01L 27/18* (2013.01); *H01L 39/12* (2013.01); *H01L 39/223* (2013.01); *H01L 39/2493* (2013.01)

(58) Field of Classification Search
CPC ........ H01L 39/025; H01L 27/18; H01L 29/12
See application file for complete search history.

(56) References Cited

U.S. PATENT DOCUMENTS

| 5,661,112 A * | 8/1997 | Hatta | H01L 39/2435 428/426 |
| 5,739,086 A * | 4/1998 | Goyal | C21D 8/12 505/473 |
| 6,423,473 B1 * | 7/2002 | Sung | H01L 39/2496 430/311 |
| 2013/0299783 A1 * | 11/2013 | Lutchyn | H01L 39/221 257/31 |

(Continued)

OTHER PUBLICATIONS

U.S. Appl. No. 16/120,433, filed Sep. 3, 2018, 80 pp.

(Continued)

*Primary Examiner* — Errol V Fernandes
(74) *Attorney, Agent, or Firm* — Klarquist Sparkman, LLP

(57) ABSTRACT

A device comprising: a portion of semiconductor; a portion of superconductor arranged to a enable a topological phase having a topological gap to be induced in a region of the semiconductor by proximity effect; and a portion of a non-magnetic material comprising an element with atomic number Z greater than or equal to 26, arranged to increase the topological gap in the topological region of the semiconductor.

20 Claims, 1 Drawing Sheet

(56) References Cited

U.S. PATENT DOCUMENTS

2019/0273196 A1      9/2019  Marcus et al.
2020/0227636 A1*    7/2020  Krogstrup Jeppesen .....................
                                                                    H01L 39/005
2021/0066570 A1*    3/2021  Luethi ................... H01L 39/223

OTHER PUBLICATIONS

U.S. Appl. No. 16/246,287, filed Jan. 11, 2019, 28 pp.
Antipov et al., "Effects of Gate-Induced Electric Fields on Semiconductor Majorana Nanowires," available at arXiv: 1801.02616v1, 16 pages (Jan. 8, 2018).
Moor et al., "Electric Field Tunable Superconductor-Semiconductor Coupling in Majorana Nanowires," available at: arXiv: 1806.00988v1, 10 pages (Jun. 4, 2018).
International Search Report and Written Opinion Issued in PCT Application No. PCT/US2020/036746, dated Sep. 21, 2020, 28 pages.
Wojcik et al., "Durability of the Superconducting Gap in Majorana Nanowires under Orbital Effects of a Magnetic Field," available at: arXiv: 1804.06101v2, 8 pages (Jun. 23, 2018).

* cited by examiner

SEMICONDUCTOR-SUPERCONDUCTOR HETEROSTRUCTURE

TECHNICAL FIELD

The disclosure relates to a heterostructure such as a nanowire comprising a combination of semiconductor and superconductor.

BACKGROUND

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to a temperature that induces superconducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

To induce a MZM the device is cooled to a temperature where the superconductor (e.g. Aluminium, Al) exhibits superconducting behaviour. The superconductor causes a proximity effect in the adjacent semiconductor, whereby a region of the semiconductor near the interface with the superconductor also exhibits superconducting properties. I.e. a topological phase behaviour is induced in the adjacent semiconductor as well as the superconductor. It is in this region of the semiconductor where the MZMs are formed.

Another condition for inducing the topological phase where MZMs can form is the application of a magnetic field in order to lift the spin degeneracy in the semiconductor. Degeneracy in the context of a quantum system refers to the case where different quantum states have the same energy level. Lifting the degeneracy means causing such states to adopt different energy levels. Spin degeneracy refers to the case where different spin states have the same energy level. Spin degeneracy can be lifted by means of a magnetic field, causing an energy level spilt between the differently spin-polarized electrons. This is known as the Zeeman effect. The g-factor refers to the coefficient between the applied magnetic field and the spin splitting. Typically the magnetic field is applied by an external electromagnet. However U.S. Ser. No. 16/246,287 has also disclosed a heterostructure in which a layer ferromagnetic insulator is disposed between the superconductor and semiconductor in order to internally apply the magnetic field for lifting the spin degeneracy, without the need for an external magnet. Examples given for the ferromagnetic insulator included compounds of heavy elements in the form of EuS, GdN, Y3Fe5O12, Bi3Fe5O12, YFeO3, Fe2O3, Fe3O4, GdN, Sr2CrReO6, CrBr3/CrI3, YTiO3 (the heavy elements being Europium, Gadolinium, Yttrium, Iron, Strontium and Rhenium).

Inducing MZMs typically also requires gating the nanowire with an electrostatic potential. However U.S. Ser. No. 16/120,433 has also disclosed a structure which is capable of exhibiting topological behaviour including MZMs without the need for gating. In this case the nanowires have a full-shell of superconductor all the way around the perimeter of the nanowire, which obviates the need for gating.

As illustrated in FIG. 1, in order to create good quality devices in which the MZMs are long-lived, it is preferable to have a large topological gap $E_g$. A material in the topological phase (whether a superconductor or a region of proximity-induced superconductivity in a semiconductor) exhibits distinct energy bands: a lower band 11 and an upper band 12. The lower band 11 is a band where the quasiparticle energy E falls in a lower range, and the upper band (or "excitation band") 12 is a band of higher quasiparticle energy. The topological gap $E_g$ is an energy window between the upper and lower bands 11, 12 where no quasiparticles can exist due to the quantized (discrete) nature of the quasiparticle energy levels. The lower band 11, upper band 12 and topological gap $E_g$ are analogous to the valence band, conduction band and band gap for electrons in a semiconductor. In the upper, excitation band 12 the quasiparticles can propagate freely through the superconductor (or proximity-induced region in a semiconductor), analogous to the electrons in the valence band in a semiconductor.

The Majoranas, whose states form the MZMs, form the lower band 11. The Majoranas are part of the computational space, i.e. the properties of the system being exploited for the quantum computing application in question. In other words the MZMs are the operating elements of the qubit. On the other hand, the particle-like excitations (quasiparticles) in the upper band 12 are not part of the computational space. If these quasiparticle cross the topological energy gap $E_g$ into the lower band 11 due to thermal fluctuations then they will destroy at least some of the MZMs. This is sometimes referred to as "poisoning" the MZMs. The gap $E_g$ provides protection for the MZMs against such poisoning. The probability of a quasiparticle existing in the upper band and crossing the gap $E_g$ from the upper to the lower band is proportional to $e^{-E_g/T}$ where T is temperature converted to energy using Boltzmann constant. Hence the larger the topological gap, the more protection is afforded to the MZMs against poisoning from the harmful quasiparticles in the upper band 12.

SUMMARY

The inventors have realized that the presence of a relatively high-Z element in proximity to the semiconductor-superconductor interface helps to increase the topological gap in a semiconductor-superconductor heterostructure.

Hence according to one aspect disclosed herein, there is provided a device comprising: a portion of semiconductor; a portion of superconductor arranged to a enable a topological phase having a topological gap to be induced in a region of the semiconductor by proximity effect; and a portion of a non-magnetic material comprising an element with atomic number Z greater than or equal to 26, arranged to increase the topological gap in the topological region of the semiconductor.

Where it is said here to increase the topological gap, this means compared to an otherwise identical device which did not include the portion of said element.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which.

DETAILED DESCRIPTION OF EMBODIMENTS

The present disclosure discloses the use of heavy elements in contact with a superconductor to increase the topological gap in a hybrid semiconductor-superconductor device, such as a device for forming a qubit. The disclosed arrangement provides a way to significantly increase spin-orbit interaction in the topological heterostructure, thus significantly increasing the potential topological gap and thereby improving properties of the qubit or other such device reliant on a topological gap. This may be exploited for example to support the goal of building a scalable topological quantum computer by improving properties of individual qubits.

As discussed previously, Majorana zero modes (MZMs) can be produced in a semiconductor-superconductor heterostructure with the application of a magnetic field (typically an externally applied magnetic field). Such a combined system experiences properties of both materials: a) spin-orbit interaction and g-factor from the semiconductor, and b) superconducting pairing from the superconductor. Spin-orbit interaction in the semiconductor is only moderate, being the main limiting factor of the size of the topological gap. Thus the size of the spin-orbit interaction limits the protection of the MZMs and the quality of the qubit that can be built using them.

The disclosed approach is to add heavy element atoms—for example, platinum, gold, silver, bismuth—in contact with a superconductor in an otherwise-conventional setup. The position of the heavy element can be either on top of the superconductor, inside the superconductor, or between the superconductor and the semiconductor. Heavy elements carry strong atomic spin-orbit interaction and it is known that the superconductor doped with those elements can inherit such spin-orbit interaction. The magnitude of the heavy element-induced spin-orbit interaction can be much larger than that inherent to the underlying semiconductor. Therefore, the disclosed idea provides a way to have a much larger spin-orbit interaction in the hybrid system, and hence much larger topological gap and much better topological protection of the MZMs.

Figure 1:
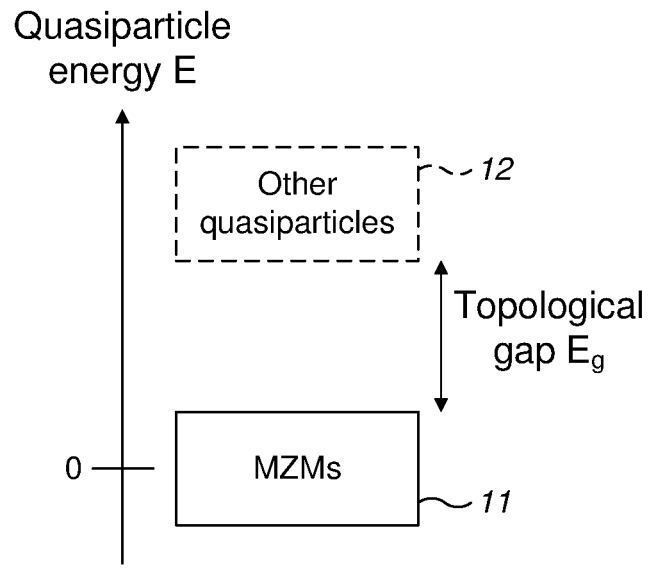
FIG. 1 schematically illustrates the concept of a topological gap.
Figure 2:
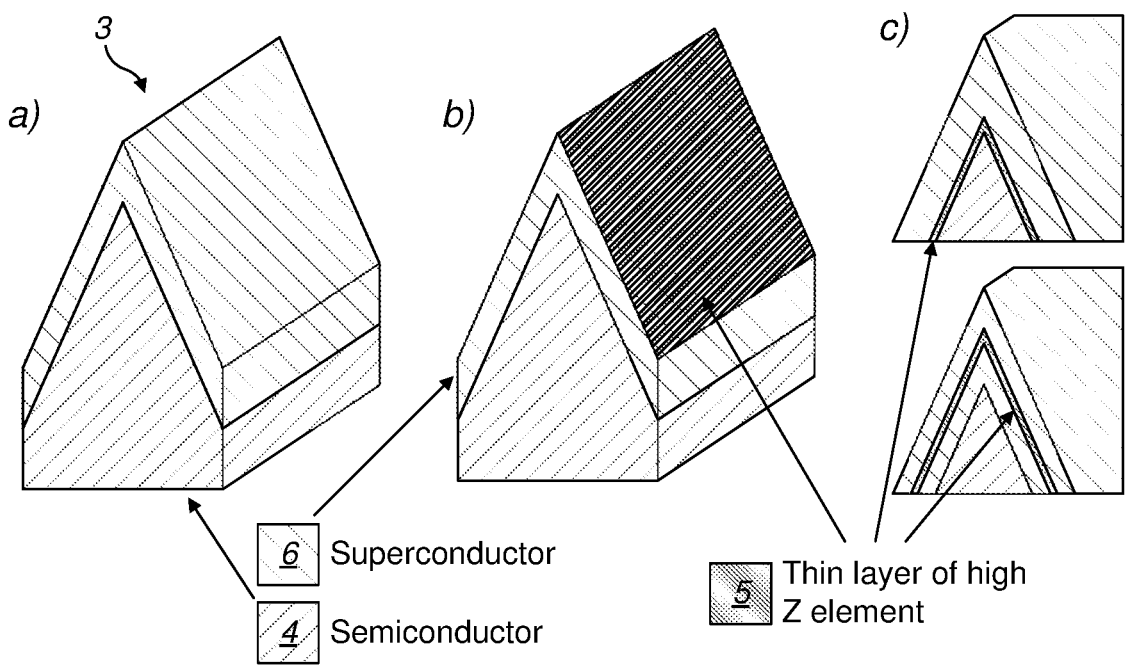
FIG. 2 schematically illustrate some example heterostructures.

Some embodiments are now described by way of example with reference to FIG. 2.

FIG. 2(a) shows an example of an existing superconductor-semiconductor heterostructure. The structure may be used to form part of a device 1, such as a quantum computing device for forming and manipulating qubits. For instance, the illustrated structure may represent a section of a nanowire 3 in a network of nanowires for forming one or more qubits.

The structure (e.g. nanowire) 3 comprises a portion of semiconductor 4 formed over a substrate 2. A layer of superconductor 6 is formed over at least part of the semiconductor. FIG. 2(a) shows an example where the superconductor 6 coats substantially all of the semiconductor core 4 of the nanowire 3. Alternatively the superconductor 6 may coat only part of the semiconductor core 4, e.g. one side or face of the semiconductor core 4 (for instance this can be achieved by depositing the superconductor 6 with an angled beam, thus leaving a shadow on one side of the nanowire). In the latter case, the exposed area of semiconductor 4 could be used for side-gating for example.

FIGS. 2 (b) and (c) show the same structure 3, but now with a thin layer of a material 5 comprising an element such as Pt (platinum) with high atomic number Z in order to enhance the spin-orbit coupling. This layer 5 can be on top of the superconductor 6 as shown in FIG. 2(b), or between the semiconductor 4 and the superconductor 6 or inside the superconductor 6 as shown in FIG. 2(c).

To maximize the effect of increasing the topological gap, preferably the thickness of the high-Z material 5 is small, most preferably not larger than one or two monolayers so as not to create subgap states due to the heavy elements and thus decrease the topological gap. Also, the distance between the layer of high-Z material 5 and the SE-SU interface (the interface between the semiconductor 4 and the layer of superconductor 6) is preferably no more than the coherence length of the superconductor (e.g. 100 nm). More preferably however a thinner layer of superconductor 6 is used so that it can better sustain a magnetic field.

All three arrangements of FIGS. 2(b) and 2(c) can work well, as the superconducting coherence length that controls how far the properties of the materials are felt through the superconductor is typically much longer than the thickness of the superconductor.

Each of the semiconductor 4, superconductor 6 and high-Z material 5 may be formed by any suitable known fabrication technique such as lithography, sputtering or an epitaxial growth technique, e.g. selective area growth (SAG). Example techniques for the deposition itself include, for example, electron-beam physical vapour deposition, plasma-enhanced chemical vapour deposition, or atomic layer deposition, and molecular beam epitaxy.

The substrate 2 herein refers to the wafer plus any additional layers formed on or over the substrate at any point in the fabrication prior to the deposition of the semiconductor 4. "Over" herein may mean either formed directly on, or indirectly over with any one or more intermediate layers in between. "On" herein means directly on, i.e. in contact with, without any intermediate layer. Note also that the terms "on" or "over" or such like, as used herein, do not necessarily imply a particular orientation relative to gravity. Rather, they refer to the position relative to the surface of the substrate 2 on which the structure 3 is being formed.

Optionally one or more further layers may be formed over the heterostructures 3. E.g. an oxide layer 8 may be formed over part or all of each heterostructure 3 (or at least some of the heterostructures). The oxide layer can be used to protect heterostructures against $O_2$ or $H_2O$ in air. Alternatively or additionally, chemical and/or mechanical protection may be provided by one or more other upper layers of the wafer or IC package (not shown). There may also be other alternative or additional layers formed over the heterostructures, such as conductive vias between the heterostructures, and/or between the heterostructures and one or more other components.

FIG. 2 illustrates a coating of superconductor material 6 formed over part or all of the heterostructure 3. At least some of the superconductor 6 may be formed directly on at least part of the high-Z material 5. And/or, at least some of the superconductor 6 may be formed directly on at least part of the high-Z material 5. The high-Z material 5 may be formed directly on some or all of the semiconductor core 4.

In embodiments, at least some of the heterostructures 3 each comprise a length or line of the semiconductor material 4, with the high-Z material 5 covering part or all of the perimeter of the line (i.e. the edge in the plane perpendicular to the line) line along some or all of the length of the line (i.e. in the direction parallel to the length of the line). In this case FIG. 2 represents a section along the line. The superconductor 6 is then formed over each such heterostructure 3, covering part or all of the perimeter of the line along some or all of the length of the line. Each such heterostructure 3 thus forms a respective semiconductor-superconductor nanowire. A network of such nanowires may be formed over the substrate 2 can be arranged to form a topological quantum computing device comprising one or more topological qubits. In operation, Majorana zero modes (MZMs) and hence the topological regime may be induced in parts of some or all of the nanowires by means of a magnetic field and cooling to a temperature at which the superconductor 6 exhibits superconducting behaviour. In embodiments the inducement of the MZMs and topological regime may further comprise gating with an electromagnetic potential. Structures for forming qubits and the inducement of MZMs and the topological regime in a semiconductor-superconductor nanowire are, in them themselves, known in the art.

Note that the FIGS. 2(a)-(c) are schematic and the shapes and dimensions shown therein are not intended to be limiting.

The layer of high-Z material 5 is introduced to strengthen the spin-orbit interaction in the topological region of the semiconductor 4, and thereby increase the topological gap therein. As such, the high-Z material should be arranged in within superconducting coherence length of the junction between the semiconductor 4 and the superconductor 6. The material 5 should comprise an element with a relatively high atomic number Z, since heavy elements carry strong spin-orbit interaction. The inventors have identified that the topological region in the semiconductor 4 can inherit such a spin-orbit interaction from the proximal high-Z material 5. The effect can be achieved with Z at least as low as 26 (Iron, Fe), but for a stronger effect preferably Z is at least 46 (Palladium). Copper (Cu, Z=29) in the former range, and silver (Ag, Z=47) in the latter range, are examples that the inventors have determined will work particularly well. The high-Z element will likely be a metal in most applications, though high-Z non metals will work as well. In embodiments particular embodiments the high-Z element may be platinum (Pt, Z=78), gold (Au, Z=79) or bismuth (Z=83). These specific examples are known in the literature to induce spin-orbit interaction into Al.

Preferably the high Z material 5 comprises the high-Z element as a pure element, i.e. the high-Z element is not formed into a compound. Preferably the layer 5 of the high-Z material comprises only the high-Z element (not in a mixture or a compound). However a weaker effect can still be achieved using a compound or mixture. Unlike disclosed in Ser. No. 16/246,287, the high-Z material is non-magnetic. In embodiments the high-Z material 5 is a conductor. A conductor is slightly preferable as the conductor can more easily transfer its properties to the superconductor (e.g. Al). In embodiments the high-Z element may be an element other than one of those disclosed for the ferromagnetic insulator in Ser. No. 16/246,287, i.e. other than Eu, Gd, Y, Fe, Sr and Re. Non-magnetic materials are necessary. Magnetic materials will create additional subgap states in the superconductor, thus effectively reducing the topological gap instead of increasing it. Iron (Fe), Cobalt (Co), Nickel (Ni) and Gadolinium (Gd) are capable of being magnetic even when not in a compound. Therefore these are less preferred candidates. However they are capable of forming non-magnetic compounds and so could be used in these forms. Fe, Co and Ni have atomic numbers 26 to 28 respectively, so in embodiments the atomic number Z of the element used may be at least 29. Yttrium (Y), Strontium (Sr), Rhenium (Re) and Europium (Eu) are capable of being magnetic but only in certain compounds. Therefore these could be used in non-magnetic compounds or as pure elements (i.e. when not in compounds).

It will be appreciated that the above embodiments have been described by way of example only.

For instance, structures other than nanowires could be used to induce MZMs in a topological region formed at a semiconductor-superconductor interface. Or more generally the present disclosure can be applied to other quantum electronic devices and spintronic devices that exploit the presence of a topological gap. E.g. the types of devices to which the disclosed techniques may apply could include qubits, nanowires, quantum hall effect devices, spintronic devices or quantum sensing devices, or any quantum hardware systems group shifting to a topologically protected.

More generally, according to one aspect disclosed herein there is provided device comprising: a portion of semiconductor; a portion of superconductor arranged to a enable a topological phase having a topological gap to be induced in a region of the semiconductor by proximity effect; and a portion of a non-magnetic material comprising an element with atomic number Z greater than or equal to 26, arranged to increase the topological gap in said region.

In embodiments, the portion of said non-magnetic material may be disposed between the portion of semiconductor and the portion of superconductor.

In some such embodiments the portion of said non-magnetic material may be in direct contact with at least part of the semiconductor on one face and in direct contact with at least part of the superconductor on another face. In embodiments there may be no other layer disposed between said portion of non-magnetic material and said portion of semiconductor. In embodiments there may be no other layer disposed between said portion of non-magnetic material and said portion of superconductor.

In alternative embodiments the portion of said non-magnetic material may be sandwiched between two layers of the portion of superconductor.

In some such embodiments one of the layers of superconductor may be in direct contact with at least part of the semiconductor. In embodiments there may be no other layer disposed between said portion of non-magnetic material and either or both of said layers of the superconductor.

In further alternative embodiments, the portion of said non-magnetic material may be disposed over the portion of superconductor.

In some such embodiments there may be no other layer disposed between said portion of non-magnetic material and said portion of superconductor.

In embodiments, in the portion of said non-magnetic material, the element is preferably not in a compound.

In embodiments, said non-magnetic material may be a conductor. In embodiments said element may be a metal.

In embodiments the atomic number Z of said element may be greater than or equal to 29. In embodiments said element may be Cu (Z=29).

In embodiments the atomic number Z of said element is may be greater than or equal to 46. In embodiments said element may be Ag (Z=47).

In embodiments the atomic number Z of said element may be greater than or equal to 78. For instance in embodiments said element may be Pt, Au or Bi (Z=28, 79, 83 respectively). In embodiments the atomic number Z of said element may be greater than or equal to 83.

In embodiments said element may be an element other than Fe. In embodiments said element may be an element other than Co. In embodiments said element may be an element other than Ni. In embodiments said element may be an element other than Gd. These all have the capability to be magnetized as pure elements (when not in a compound), and therefore are less preferred candidates.

In embodiments said element may be an element other than Sr. In embodiments said element may be an element other than Y. In embodiments said element may be an element other than Eu. And/or, embodiments said element may be an element other than Re. These are only capable of being magnetic when in certain compounds.

In embodiments the semiconductor may comprise InAs, InSb, GaAs or GaSb.

In embodiments the superconductor may comprise Al.

In embodiments, the device may take the form of a topological quantum computing device comprising a network of semiconductor-superconductor nanowires, each nanowire comprising a length of semiconductor formed over a substrate and a coating of superconductor formed over at least part of the semiconductor. In this case said portion of semiconductor comprises the semiconductor of each nanowire, said portion of superconductor comprises the superconductor coating of each nanowire, and the portion of said element is disposed within one, some or all of the nanowires.

According to another aspect disclosed herein, there is provided a method of operating the topological quantum computing device, the method comprising: cooling the device to a temperature inducing superconductivity in the superconductor; and applying a magnetic field to said region in order to lift spin-degeneracy in said region; thus creating said proximity effect in said region and inducing majorana zero modes in said region.

In embodiments the magnetic field may be applied from a magnet external to said device. Alternately the magnetic field may be applied from a source internal to the device, such as a layer of ferromagnetic material such as EuS.

In embodiments, the method may further comprise gating one, some or all of the nanowires with an electrostatic potential.

According to another aspect disclosed herein, there is provided a method of fabricating a device, the method comprising: forming a portion of semiconductor over a substrate; and forming a portion of superconductor over the semiconductor, arranged to a enable a topological phase having a topological gap to be induced in a region of the semiconductor by proximity effect; wherein the method comprises forming a portion of a non-magnetic material comprising an element with atomic number Z greater than or equal to 26 either on the portion of semiconductor, between the portion of semiconductor and the portion of superconductor, or between two layers of the superconductor, the portion of said element thereby being arranged to increase the topological gap in said region.

Other variants or use cases of the disclosed techniques may become apparent to the person skilled in the art once given the disclosure herein. The scope of the disclosure is not limited by the described embodiments but only by the accompanying claims.

The invention claimed is:

1. A device comprising:
    a portion of semiconductor;
    a portion of superconductor arranged to a enable a topological phase having a topological gap to be induced in a region of the semiconductor by proximity effect; and
    a portion of a non-magnetic material comprising an element with atomic number Z greater than or equal to 26, arranged to increase the topological gap in said region, the portion of non-magnetic material having a thickness of less than or equal to 2 monolayers.

2. The device of claim 1, wherein said element is Bi and is disposed between the portion of semiconductor and the portion of superconductor.

3. The device of claim 1, wherein the portion comprising said element is sandwiched between two layers of the portion of superconductor.

4. The device of claim 1, wherein the portion comprising said element is disposed over the portion of superconductor.

5. The device of claim 1, wherein in the portion comprising said element, the element is not in a compound.

6. The device of claim 1, wherein the portion comprising said element is a conductor.

7. The device of claim 1, wherein said element is a metal.

8. The device of claim 1, wherein the atomic number Z of said element is greater than or equal to 46.

9. The device of claim 8, wherein said element is Ag.

10. The device of claim 8, wherein the atomic number Z of said element is greater than or equal to 78.

11. The device of claim 10, wherein said element is Pt, Au or Bi.

12. The device of claim 1, wherein said element is an element other than Fe, Ni, Co and Gd.

13. The device of claim 1, wherein said element is an element other than Eu, Y, Sr and Re.

14. The device of claim 1, wherein the semiconductor comprises InAs, InSb, GaAs or GaSb.

15. The device of claim 1, wherein the superconductor comprises Al.

16. The device of claim 1, in the form of a topological quantum computing device comprising a network of semiconductor-superconductor nanowires, each nanowire comprising a length of semiconductor formed over a substrate and a coating of superconductor formed over at least part of the semiconductor; wherein said portion of semiconductor comprises the semiconductor of each nanowire, said portion of superconductor comprises the superconductor coating of each nanowire, and the portion of said element is disposed within one, some or all of the nanowires.

17. A method of operating the topological quantum computing device of claim 16, comprising:
    cooling the device to a temperature inducing superconductivity in the superconductor; and
    applying a magnetic field to said region in order to lift spin-degeneracy in said region;

thus creating said proximity effect in said region and inducing majorana zero modes in said region.

18. The method of claim 17, wherein the magnetic field is applied from a magnet external to said device.

19. The method of claim 17, further comprising gating one, some or all of the nanowires with an electrostatic potential.

20. A method of fabricating a device, the method comprising:
   forming a portion of semiconductor over a substrate; and
   forming a portion of superconductor over the semiconductor, arranged to a enable a topological phase having a topological gap to be induced in a region of the semiconductor by proximity effect;
   wherein the method comprises forming a portion of a non-magnetic material comprising an element with atomic number Z greater than or equal to 26 either on the portion of semiconductor, between the portion of semiconductor and the portion of superconductor, or between two layers of the superconductor, the portion of said element thereby being arranged to increase the topological gap in said region and having a thickness of less than or equal to 2 monolayers.

* * * * *